United States Patent [19]
Blood et al.

[11] Patent Number: 5,107,306
[45] Date of Patent: Apr. 21, 1992

[54] SEMICONDUCTOR DEVICE HAVING A WAVEGUIDE STRUCTURE

[75] Inventors: Peter Blood, Wotton; Charles T. Foxon, Crawley, both of England

[73] Assignee: U.S. Philips Corp., New York, N.Y.

[21] Appl. No.: 412,023

[22] Filed: Sep. 25, 1989

[30] Foreign Application Priority Data

Sep. 28, 1988 [GB] United Kingdom ............... 8822805

[51] Int. Cl.$^5$ ........................................... H02L 27/12
[52] U.S. Cl. .......................................... 357/4; 357/16; 357/17; 372/45
[58] Field of Search ................ 357/4, 4 SL, 17, 16; 372/45, 46

[56] References Cited

U.S. PATENT DOCUMENTS

| | | | |
|---|---|---|---|
| 4,439,782 | 3/1984 | Holonyak, Jr. | 357/4 SL |
| 4,654,090 | 3/1987 | Burnham et al. | 357/4 SL |
| 4,671,830 | 6/1987 | Burnham | 372/45 |
| 4,731,789 | 3/1988 | Thornton | 357/4 SL |
| 4,860,297 | 8/1989 | Hayakawa et al. | 372/45 |
| 4,905,246 | 2/1990 | Hayakawa et al. | 357/4 |

FOREIGN PATENT DOCUMENTS

| | | | |
|---|---|---|---|
| 58-207684 | 12/1983 | Japan | 357/4 SL |
| 60-130878 | 7/1985 | Japan | 372/45 |
| 62-18081 | 1/1987 | Japan | 372/45 |
| 62-209884 | 9/1987 | Japan | 372/45 |

OTHER PUBLICATIONS

Coleman et al., "High-barrier cluster-free $Al_xGa_{1-x}$-As-AlAs-GaAs quantum-well heterostructure laser," *Applied Physics Letters* 38(2), Jan. 1981, pp. 63–65.

*Primary Examiner*—Andrew J. James
*Assistant Examiner*—Courtney A. Bowers
*Attorney, Agent, or Firm*—Steven R. Biren

[57] ABSTRACT

A first doped region (20) is grown on a semiconductor substrate (1) as a superlattice region having alternate layers (21, 22) of a first and second semiconductor material followed by a waveguide region (30) having at least a superlattice region with alternate layers (31, 32) of the first and second semiconductor materials. A second doped region (40) is then grown as a superlattice including alternate layers (41, 42) of the first and second semiconductor materials on the waveguide region (30). The first and second doped regions (20 and 40) are grown so that the layers (21, 22, 41, 42) of the first and second semiconductor materials are sufficiently thin and are sufficiently highly doped as to become disordered during growth so that the first and second doped regions (20 and 40) are formed by an alloy of the first and second semiconductor materials having a lower refractive index and larger bandgap than the waveguide superlattice region (30). The device may be a semiconductor laser and the waveguide region (30) may be formed as two superlattice regions (30a, 30b) separated by an active region (50) of the laser.

8 Claims, 3 Drawing Sheets

SEMICONDUCTOR DEVICE HAVING A WAVEGUIDE STRUCTURE

BACKGROUND OF THE INVENTION

This invention relates to a method of manufacturing a semiconductor device and to such a device, for example a semiconductor laser device.

EP-A-166593 describes a semiconductor device having a waveguide structure, for example a semiconductor laser device, where the device is formed by growing a first doped region as a superlattice region comprising alternate layers of a first and a second semiconductor material on a semiconductor device substrate. A waveguide region is grown comprising at least a superlattice region comprising alternate layers of the first and second semiconductor materials on the first doped region, and a second doped region is grown as a superlattice comprising alternate layers of the first and second semiconductor materials on the waveguide region.

As described in EP-A-166593, the waveguide region comprises first and second superlattice regions bounding a quantum well region forming the active region of the, for example, laser device and the first and second doped regions are oppositely doped to form a diode struture for enabling carriers to be injected into the active region when a forward biasing voltage is applied across the device.

The first and second materials used to form the superlattice regions of the device described in EP-A-166593 are binary compounds, for example gallium arsenide (GaAs) and aluminum arsenide (AlAs), and in order to enable the waveguide region to act as a confinement region for the active region the relative thicknesses of the first and second material layers are different in the first and second superlattice regions of the waveguide region from the relative thicknesses of the first and second material layers in the first and second doped regions. In particular, where the first and second material layers are formed of aluminum arsenide and gallum arsenide then the thickness of the gallum arsenide layers is increased in the first and second superlattice regions of the waveguide region so that the fraction or percentage of aluminum is less in the waveguide region than in the first and second doped regions and so the waveguide region has a smaller effective bandgap and higher refractive index than the first and second doped regions, enabling the waveguide region to function in operation of the device as a waveguide for light generated in the active region and as a confinement region for injected carriers.

SUMMARY OF THE INVENTION

It is an aim of the present invention to provide a semiconductor device having a waveguide structure and a method of manufacturing such a device in which the first and second doped regions and the waveguide region comprise superlattices of first and second materials and the waveguide region is formed so as to have a smaller bandgap and higher refractive index than the first and second doped regions without, necessarily, having to alter the relative thicknesses of the first and second material layers from one superlattice to another.

According to one aspect of the present invention, there is provided a method of manufacturing a semiconductor device having a waveguide structure, which method comprises growing a first doped region as a superlattice region comprising alternate layers of a first and a second semiconductor material on a semiconductor substrate, growing a waveguide region comprising at least a superlattice region comprising alternate layers of the first and second semiconductor materials on the first doped region, and growing a second doped region as a superlattice comprising alternate layers of the first and second semiconductor materials on the waveguide region, characterized by growing the first and second doped regions so that the layers of the first and second semiconductor materials are sufficiently thin and are sufficiently highly doped as to become disordered during growth so that the first and second doped regions are formed by an alloy of the first and second semiconductor materials having a lower refractive index and larger bandgap than the waveguide superlattice region.

In another aspect, the present invention provides a semiconductor device having a waveguide structure, which device comprises a first doped region grown on a semiconductor substrate as a superlattice region comprising alternate layers of a first and a second semiconductor material, a waveguide region grown on the first doped region and comprising at least a superlattice region comprising alternate layers of the first and second semiconductor materials and a second doped region grown on the waveguide region as a superlattice region comprising alternate layers of the first and second semiconductor materials, characterized in that the layers forming the first and second doped regions are sufficiently thin and highly doped that disordering during growth causes the first and second doped regions to be formed of an alloy of the first and second semiconductor materials having a lower refractive index and a larger bandgap than the waveguide superlattice region.

Thus, using a method embodying the invention, a semiconductor device having a waveguide structure can be manufactured by causing the layers of the first and second materials forming the first and second doped regions to be so heavily doped and so thin that the diffusion of the dopant impurities during growth causes the layers forming the first and second regions to become disordered and so to form an alloy which has an average composition determined by the relative thicknesses of the layers of the first and second materials and which has a larger bandgap and lower refracture index than the waveguide undisordered superlattice region. Thus, the desired waveguide can be formed by using a simple growth process, for example using a conventional molecular beam epitaxy (MBE) or metal organic vapor phase epitaxy technique (MOVPE), simply by growing alternate layers of the two materials and ensuring that the first and second doped regions are sufficiently highly doped so as to be disordered during growth to form alloy regions. Thus, the invention enables advantage to be taken of the good morphology of superlattice structures while allowing in situ formation of alloy regions during growth. A device manufactured by a method embodying the invention, for example a semiconductor laser device, may exhibit better electrical conduction transverse to the layers of the first and second doped regions and may simplify forming highly doped contact regions. Moreover, unless desired, it is not necessary for the relative thicknesses of the layers of the first and second materials to be adjusted when growing the waveguide superlattice region. Thus, all of the layers of the first material may be of the same thickness throughout the structure as may all the layers of the second material.

It should be understood that, as used herein, the term 'quantum well' means a potential well for charge carriers, in particular for electrons and possibly also for holes, defined by a layer of a relatively small bandgap material sandwiched between barrier layers of relatively large bandgap material with the layer of the relatively small bandgap material having a thickness less than or of the order of the electron de Broglie wavelength so that the energy levels within the potential well are quantized. As used herein, the term 'superlattice' should be understood to mean a structure consisting of alternate layers of wide and narrow bandgap materials with the layers being so thin that the wavefunctions of charge carriers in similar states in adjacent layers of the same material overlap.

In a semiconductor device embodying the invention, the layers of the first and second materials may be of the order of a few, for example three to ten, monolayers thick with the term monolayer being understood to mean a single layer of the semiconductor material, for example a single layer of gallium and arsenic atoms where the semiconductor material is gallium arsenide.

The waveguide region may comprise two superlattice regions separated by an active region which may comprise one or more quantum wells formed of one of the first and second materials bounded by barrier layers of the other of the first and second materials. Alternatively, the active region could comprise a superlattice. Where the device is to be, for example, a semiconductor laser device then the first and second doped regions may be doped with impurities of opposite conductivity types. Thus, for example, when the first and second materials are III-V semiconductor compounds such as gallium arsenide and aluminum arsenide one of the first and second doped regions may be doped with silicon so as to form an n conductivity type region and the other with beryllium so as to form a p conductivity type region. A laterally confined waveguide region may be formed by, after growth of the second doped region, introducing impurities, for example zinc or silicon atoms, via masking means into spaced-apart areas of a free surface of the device to form spaced-apart alloy regions of the opposite conductivity type extending downwardly through the second doped region and the waveguide region into the first doped region.

BRIEF DESCRIPTION OF THE DRAWING

Embodiments of the invention will now be described, by way of example, with reference to the accompanying drawing, in which.

Figure 1:
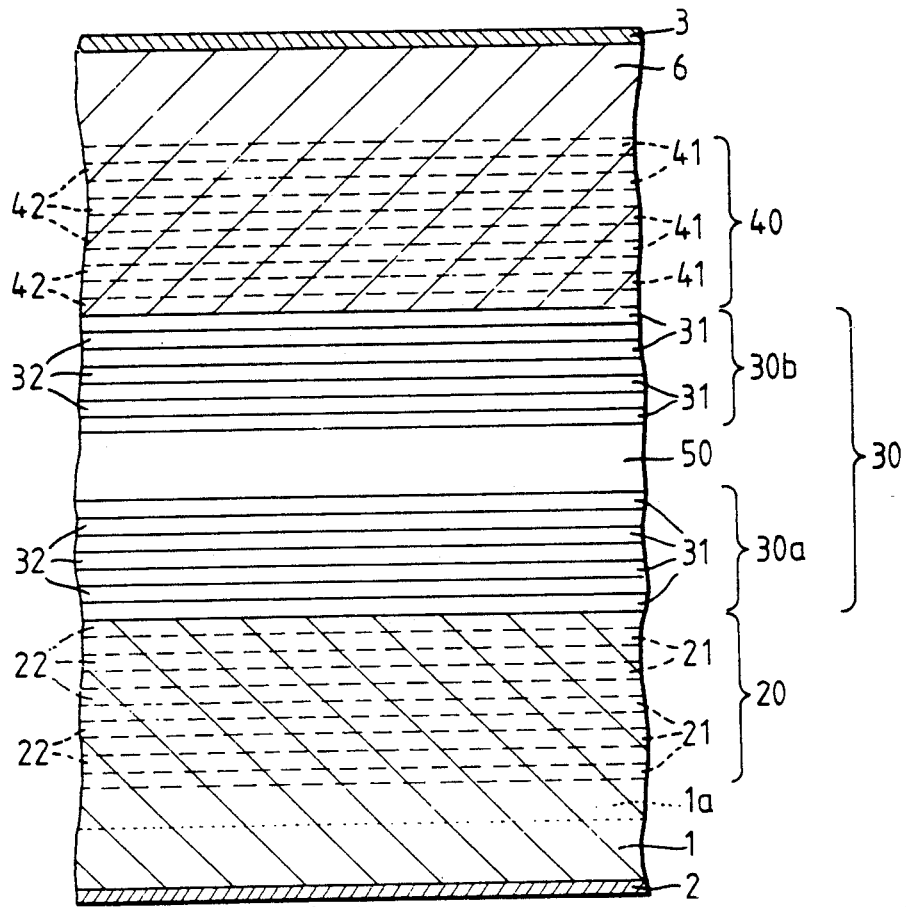
FIG. 1 is a schematic cross-sectional view of one embodiment of a semiconductor device in accordance with the invention.

It should be understood that the Figures are merely schematic and are not drawn to scale. In particular certain dimensions such as the thickness of layers or regions may have been exaggerated while other dimensions may have been reduced. It should also be understood that the same reference numbers are used throughout the Figures to indicate the same or similar parts.

DESCRIPTION OF THE PREFERRED EMBODIMENTS

Referring now to the drawing, a semiconductor device having a waveguide structure in accordance with the invention, for example a semiconductor laser, is manufactured by growing a first doped region as a superlattice region 20 comprising alternate layers 21 and 22 of a first and a second semiconductor material on a semiconductor substrate 1. A waveguide region 30 is then grown on the first doped region 20 comprising at least a superlattice comprising alternate layers 31 and 32 of the first and second semiconductor materials followed by a second doped region 40 which, like the first doped region 20, is grown as a superlattice comprising alternate layers 41 and 42 of the first and second materials.

In accordance with the invention, the first and second doped regions 20 and 40 are grown so that the layers 21, 22, 41, 42 of the first and second semiconductor materials are sufficiently thin and highly doped as to become disordered during growth so that the first and second doped regions 20 and 40 are formed by an alloy of the first and second semiconductor materials having a lower refractive index and larger bandgap than the waveguide region 30, the first and second doped regions 20 and 40 thus bound the waveguide region 30 to form a waveguide structure which may, as will be described below, form a confinement area for a semiconductor laser or may be used in a waveguide modulator or optical switch.

A semiconductor device embodying the invention may be manufactured using any suitable technique which enables the controlled growth on a substrate of layers which are of the order of only a few monolayers thick. Thus, for example, a technique such as molecular beam epitaxy (MBE), metal organic vapor phase epitaxy (MOVPE), or metal organic MBE (sometimes called gas source MBE) may be used. In the examples to be described below, the alternate layers of the first and second materials are grown in a conventional molecular beam epitaxy machine such as the Gen II manufactured by Varian Associates of Palo Alto, Calif., U.S.A.

Referring now specifically to FIG. 1, there is shown a cross-sectional view of a separate confinement quantum well laser embodying the invention.

As can be seen from FIG. 1, the waveguide region comprises first and second superlattice regions 30a and 30b which bound an active region 50 of the laser, that is the region in which generation of laser light occurs. In order to enable operation of the device as an electrically pumped laser, the first and second doped regions 20 and 40 are oppositely doped, with the first doped region 20 being, in this example, of n conductivity type and the second doped region 40 being of p conductivity type. A p conductivity type capping layer 6 is provided on top of the second doped region 40 and electrical contacts 2 and 3 are provided on the substrate 2 and capping layer 6, respectively, to enable a voltage to be applied across the device which is this example effectively forms a p-i-n diode type structure, although the waveguide region 30 may be lowly doped with impurities of either n or p conductivity type.

In this example, the substrate 1 is a monocrystalline gallium arsenide substrate with a (100) surface which is highly doped, for example, to a level of $2\times10^{18}$ atoms cm$^{-3}$, with impurities of n conductivity type, for example silicon, and the first and second semiconductor materials are gallium arsenide and aluminum arsenide. Accordingly, the MBE machine to be used to grow the laser shown in FIG. 1 is provided with five effusion cells or sources for providing respective beams of gallium, arsenide aluminum, silicon and beryllium. It should, of course, be understood that certain of the beams may be molecular beams, for example the arsenic beam may be an As$_2$ or As$_4$ beam, while others of the beams may be atomic beams, for example, the dopant beams may be formed as beams of silicon and beryllium atoms.

A method embodying the invention for manufacturing the laser shown in FIG. 1 will now be described. Assuming that the gallium arsenide substrate 1 is already positioned on the support stage in the vacuum chamber of the MBE machine in which a pressure of about $5\times10^{-11}$ Torr is being maintained, the effusion cells are first heated under the control of respective thermocouples to produce the desired fluxes, all the shutters being closed at this stage. The GaAs substrate 1 is then heated, for example by a substrate heater, and the shutter of the arsenic source effusion cell opened to subject the substrate to an As$_2$ (or As$_4$) molecular beam or flux of, for example, $2\times10^{15}$ atoms cm$^{-2}$sec$^{-1}$, the heating of the substrate being sufficient to remove the volatile oxide from the substrate. Growth is then initiated by bringing the substrate to a desired growth temperature, for example 700 degrees Celsius in the As$_2$ (As$_4$) molecular beam and opening the shutters of the gallium and silicon source effusion cells 5 so as to direct beams of gallium and silicon with respective fluxes of, for example, $6\times10^{14}$ atoms cm$^{-2}$sec$^{-1}$ and $5.6\times10^{10}$ atoms cm$^{-2}$sec$^{-1}$ at the substrate surface to enable an epitaxial layer of n+conductivity type gallium arsenide to be grown. The first gallium arsenide layer may be a buffer epitaxial layer 1a of a thickness of about 0.5 to 1 micrometers as indicated by the dotted line in FIG. 1.

After formation of the buffer layer 1a, the shutters of the gallium and aluminum effusion cells are alternately opened and closed (that is so that the shutter of the gallium cell is closed when the shutter of the aluminum cell is open and vice versa) with the shutters of the silicon and arsenic effusion cells remaining open so as to grow alternate layers 21 and 22 of n conductivity type aluminum arsenide and n conductivity type gallium arsenide. Typically, the effusion cells may be arranged to provide an aluminum beam with a flux of $6\times10^{14}$ atoms cm$^{-2}$sec$^{-1}$, a gallium beam with a flux of $6\times10^{14}$ atoms cm$^{-2}$sec$^{-1}$, and an arsenic beam with a flux of $2\times10^{15}$ atoms cm$^{-2}$sec$^{-1}$. In order to achieve the desired disordering of the layers 21 and 22 while avoiding possible problems such as saturation and/or segregation effects the silicon beam should have a flux sufficient to provide a dopant concentration in the layers 21 and 22 lying in the range of from about $1\times10^{18}$ atoms cm$^{-3}$ to about $5\times10^{18}$ atoms cm$^{-3}$. In this example, the flux for the silicon beam is selected to be $5.6\times10^{10}$ atoms cm$^{-2}$sec$^{-1}$ so that each of the layers 21 and 22 is doped to about $2\times10^{18}$ atoms cm$^{-3}$ with silicon atoms.

The layers 21 and 22 are grown so as to be sufficiently thin to form a superlattice.

In this example, the layers 21 and 22 are both of the order of a few monolayers thick so as to form a superlattice (AlAs)n(GaAs)m where m and n indicate the number of monolayers of aluminum arsenide (AlAs) and gallium arsenide (GaAs), respectively. Typical values for n and m are 3, 6, 9 and n may, but need not necessarily, be equal to m. It should of course be understood that n and m may be varied through the structure.

The number of layers 21 and 22 grown will depend on the desired thickness of the first doped region 20 and the thickness of each individual layer 21 and 22. Although only a total of ten layers 21 and 22 are shown in FIG. 1, it should be appreciated that, in practice, there will be many more layers. Typically, the first doped region 20 may have a thickness of about 1.5 micrometers and where each of the layers 21 and 22 is say six monolayers thick, then the total number of layers 21 and 22 in the first doped region 20 will be about six hundred (three hundred layers 21 plus three hundred layers 22), with one monolayer being about 2.83 Angstoms.

After the desired thickness of the first doped region 20 has been formed, the shutter of the silicon effusion cell is closed and the pattern of alternately opening and closing the shutters of the aluminum and gallium continued to grow the first waveguide superlattice region 30a as a region of layers 31 of aluminum arsenide alternating with layers 32 of gallium arsenide. The layers 31 and 32 may be intrinsic, that is not intentionally doped, or may be very lowly doped, for example to $1\times10^{17}$ atoms cm$^{-3}$, with either n or p type impurities. The first waveguide superlattice region 30a may have a thickness of about 0.1 micrometers. The layers 31 and 32 may have the same thickness as the layers 21 and 22, respectively.

After formation of the final aluminum arsenide layer 31 of the first waveguide superlattice region 30a, the aluminum source shutter is closed and the gallium arsenide shutter opened to grow the active region 50 as a single quantum well of gallium arsenide of a thickness of, for example, 60 Angstroms.

Once the active region 50 has been formed, the gallium source shutter is closed and the aluminum source shutter opened to commence growth of the first aluminum arsenide layer 31 of the second waveguide superlattice region 30b. The aluminum and gallium source shutters are then alternately closed and opened as described above with the shutter of the arsenic cell open so as to grow further alternate layers 31 and 32 of undoped or very lowly doped aluminum arsenide and gallium arsenide so as to complete the second waveguide superlattice region 30a. Thereafter, the shutter of the beryllium effusion cell is opened and the procedure of opening and closing the shutters of the aluminum and gallium effusion cells continued to grow alternate p conductivity type layers 41 and 42 of aluminum arsenide and gallium arsenide, respectively to form the second doped region 40. The layers 41 and 42 may have the same thickness as the layers 21 and 22 respectively and the entire second doped region 40 will be of a similar thickness to that of the first doped region 20. In order to achieve the desired disordering of the layers 41 and 42 while avoiding possible saturation and/or segregation effects and bearing in mind the relatively rapid rate of diffusion of beryllium atoms, the beryllium beam should have a flux sufficient to provide a dopant concentration in the layers 41 and 42 lying in the range of from about $1\times10^{18}$ atoms cm$^{-3}$ to about $1\times10^{19}$ atoms cm$^{-3}$. In this example, the flux of the beryllium beam is selected to provide a dopant concentration within the layers 41 and 42 of about $4 \times 10^{18}$ atoms cm$^{-3}$.

As will be appreciated from the above, the first and second waveguide superlattice regions 30a and 30b and the second doped region 40 are only shown very schematically in FIG. 1 and will in practice consist of many more layers than shown, the second doped region 40 having a similar number of layers 41 and 42 to the first doped region 20 and the first and second waveguide superlattice regions 30a and 30b having about 60 layers 31 and 32 each.

A final capping layer 6 of p conductivity type gallium arsenide is then grown to a thickness of about 0.5 to 1 micrometers and electrically conductive layers deposited to provide the electrical contacts 2 and 3 to enable a voltage to be applied across the device so that the threshold current for enabling laser light generation can be reached. The electrically conductive layers forming the contacts 2 and 3 may be of any suitable metal or metal alloy. Thus, for example, the contact 2 may be formed of an AuGeNi alloy and the contact 3 of an AuZn alloy.

As indicated above, the layers 21, 22, 41, 42 forming the first and second doped regions 20 and 40 are so heavily doped and sufficiently thin that diffusion of the silicon and beryllium dopant atoms respectively during the growth of the laser structure shown in FIG. 1 causes the layers 21 and 22 and the layers 41 and 42 to become mixed or disordered so that the first and second doped regions 20 and 40, although grown as superlattice structures as indicated by the dashed lines in FIG. 1, are in fact when growth of the structure is complete formed by an alloy $Al_xGa_{1-x}As$ of the first and second materials with the average value of x being given by $$\frac{n}{m+n}$$

where n and m are, as indicated above, the thickness in monolayers of the aluminum arsenide layers 21 and 41 and the gallium arsenide layers 22 and 42, respectively. Where the aluminum arsenide and gallium arsenide layers have the same thickness then on average x will be 0.5. However, as will be appreciated the composition of the alloy can be adjusted relatively easily as desired by altering the ratio of the thickness of the aluminum arsenide layers 21 and 41 to the thickness of the gallium arsenide layers 22 and 42.

Figure 2:
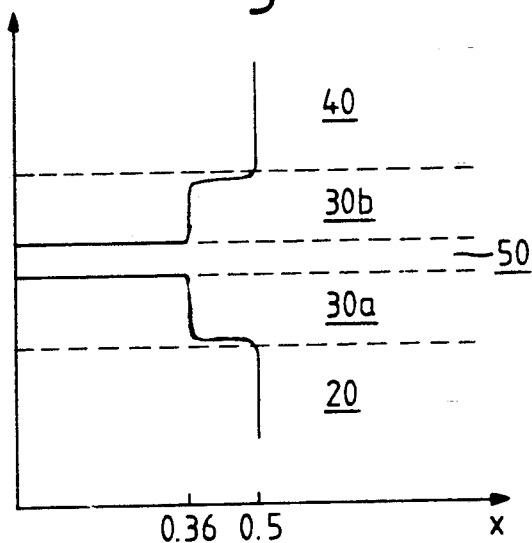
FIG. 2 is a graph illustrating the change in the local average percentage x of a particular component across part of the semiconductor device shown in FIG. 1.

FIG. 2 is a graph illustrating the change in the composition, as indicated by the local average fraction x of aluminum contained within the waveguide region 30 and the bordering first and second doped regions 20 and 40. The dashed lines in FIG. 2 illustrate the boundaries between the regions 20, 30a, 50, 30b and 40.

As will be appreciated and as is evident from FIG. 2, the quantum well active region 50 being purely a gallium arsenide layer contains no aluminum so that the fraction or proportion x of aluminum in the active region 50 is zero. It should of course be appreciated that the active region 50 could contain aluminum and could be, for example, a superlattice region. The first and second waveguide superlattice regions 30a and 30b being undoped or very lowly doped do not become disordered during growth and so remain as ordered alternate layers of aluminum arsenide and gallium arsenide. It should, of course, be appreciated that, as the first and second waveguide superlattice regions 30a and 30b remain as undisordered superlattice regions, the fraction of aluminum will not in fact, as shown in FIG. 2, vary smoothly across the first and second waveguide superlattice regions 30a and 30b but will alter abruptly between the layers 31 and 32 with x=1 in the aluminum arsenide layers 31 and x=0 in the gallium arsenide layers 32. Such abrupt variations over the very thin layers 31 and 32 would however be difficult to represent schematically with any clarity and accordingly the local average percentage x of aluminum has been shown for the first and second waveguide superlattice regions 30a and 30b, it being appreciated by those skilled in the art that such a superlattice of alternate layers of equal thickness gallium arsenide and aluminum arsenide has a bandgap equivalent to that of an $Al_xGa_{1-x}As$ alloy with x=0.36.

As indicated above, because the layers 21, 22, 41 and 42 of the first and second doped regions are so thin and highly doped, the first and second doped regions 20 and 40 become disordered during growth forming an alloy $Al_xGa_{1-x}As$ which has a composition determined by the relative thickness of the aluminum arsenide and gallium arsenide layer so that where the aluminum arsenide and gallium arsenide layers are of equal thickness the alloy forming the first and second doped regions 20 and 40 will have an average composition $Al_{0.5}Ga_{0.5}As$, that is, x=0.5, as indicated in FIG. 2. The dopant within the first and second doped regions 20 and 40 may diffuse across the boundary into the adjoining first and second waveguide superlattice regions 30a and 30b respectively, so that some disordering occurs in the outermost parts of the first and second waveguide superlattice regions 30a and 30b adjoining the first and second doped regions 20 and 40 and for this reason FIG. 2 does not show an abrupt change in the local average percentage x of aluminum at the boundaries between the undoped waveguide superlattice regions 30a and 30b and the first and second doped regions 20 and 40 but indicates, very schematically, a degree of diffusion into the undoped waveguide superlattice regions 30a and 30b.

As indicated above, the undisordered first and second waveguide superlattic regions 30a and 30b have an effective bandgap equivalent to, in this example, an aluminum gallium arsenide alloy $Al_xGa_{1-x}As$ with x=0.36 while the disordered first and second doped regions 20 and 40 are formed by an $Al_xGa_{1-x}As$ alloy with x=0.5. As is known in the art, the bandgap between the conduction and valence bands of an alloy $Al_xGa_{1-x}As$ varies with the fraction x of aluminum present so that the bandgap increases with the increase in the fraction x of aluminum present while the refractive index of such a region is inversely related to the fraction x of aluminum present. Thus in the laser shown in FIG. 1, the first and second waveguide superlattice regions 30a and 30b have a lower effective bandgap and higher refractive index than the first and second doped disordered superlattice regions 20 and 40. The first and second waveguide superlattice regions 30a and 30b thus form a separate confinement area for trapping electrons, facilitating the introduction of electrons into the quantum well active region 50 during operation of the laser and so facilitating a reduction in the threshold current necessary to achieve lasing. Furthermore, the intrinsic first and second waveguide superlattice regions 30a and 30b act as a waveguide for laser light generated during operation of the device. Also the laser shown in FIG. 1 should exhibit better electrical conduction transverse to the layers of the first and second doped regions 20 and 40 than a similar laser where the corresponding regions are formed by superlattices. Moreover, with a device in accordance with the invention where the first and second regions are highly doped, formation of the highly doped contact regions, in the example shown in FIG. 1 the substrate 1 and capping layer 6, may be simplified.

As described above, the separate confinement structure is achieved by growing the first and second doped regions 20 and 40 as superlattices of alternate layers of first and second materials with the layers being so thin and highly doped that the superlattices disorder during growth to form an alloy having an average composition determined by the relative thicknesses of the layers of the first and second materials. The growth of the first and second doped regions 20 and 40 as superlattices enables good control over the composition of the first and second doped regions 20 and 40 and moreover takes advantage of the good morphology of superlattice structures. Furthermore, the fact that the disordering of the first and second doped regions 20 and 40 is achieved during growth enables the location of the dopant and hence the change in the effective bandgap and refractive index to be much more precisely controlled than would be possible if disordering was induced by dopant diffused into the structure after growth. Indeed, as will be appreciated by persons skilled in the art, the laser semiconductor device shown in FIG. 1 could not, in practice, be formed by introducing dopant after growth to disorder the first and second regions because dopant diffused into the structure after growth could not diffuse through the structure to disorder the first region 20 without also disordering both the waveguide region formed by the intrinsic first and second waveguide superlattice regions 30a and 30b and the quantum well active region.

Figure 3:
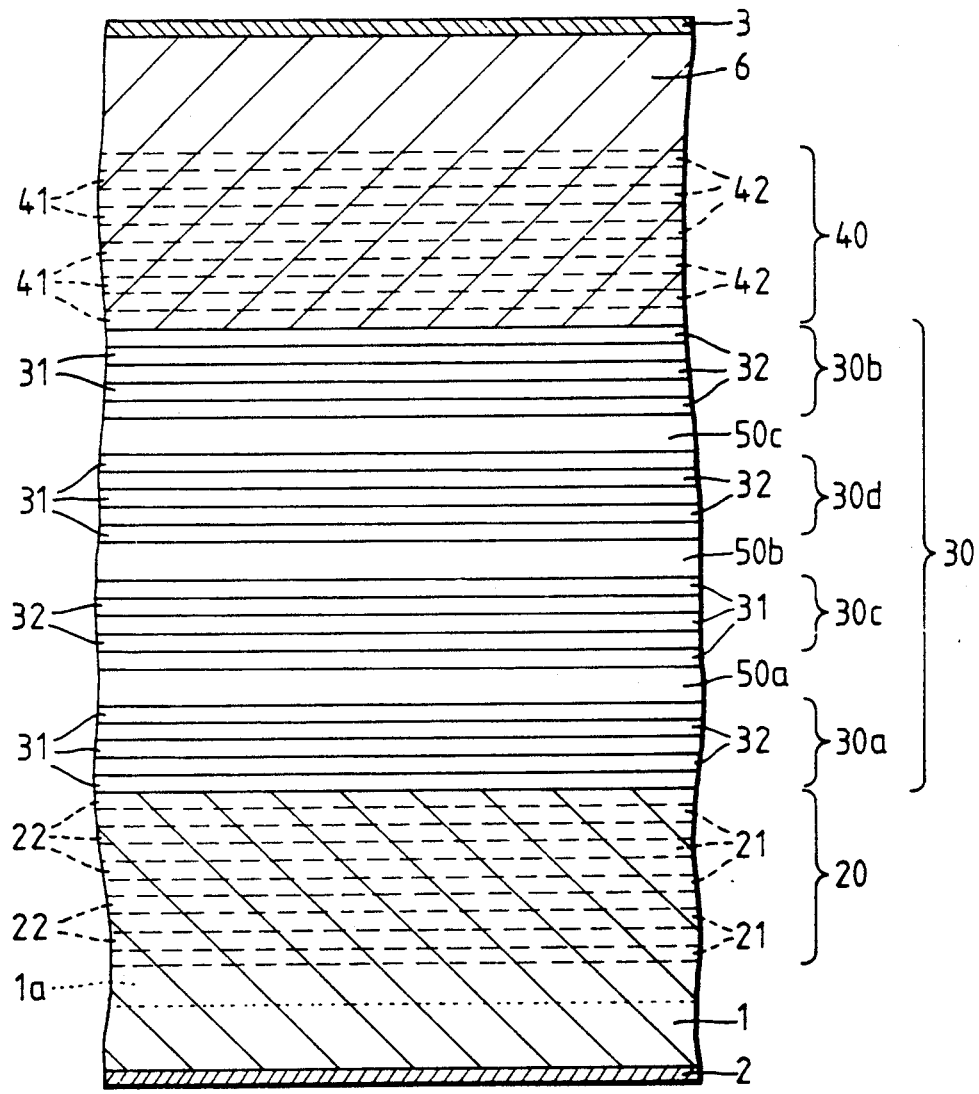
FIG. 3 is a schematic cross-sectional view of a second embodiment of a semiconductor device in accordance with the invention.
Figure 4:
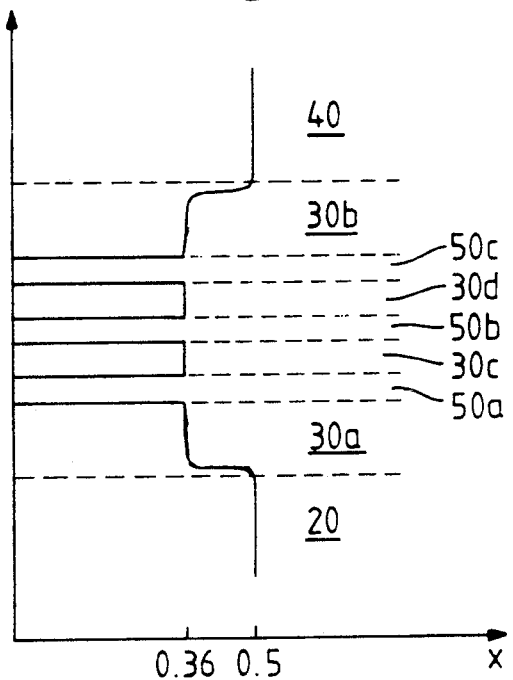
FIG. 4 is a graph illustrating the change in the local average percentage x of a particular component across part of the semiconductor device shown in FIG. 3.

FIG. 3 illustrates a laser semiconductor device similar to FIG. 1 except that the growth of the structure has been modified to provide three quantum well active regions 50a, 50b and 50c separated by barrier regions 30c and 30d formed as or not-intentionally or very lowly doped superlattices of alternate layers 31 and 32 of aluminum arsenide and gallium arsenide. FIG. 4 is a graph similar to FIG. 2 illustrating the change in the local average fraction x of aluminium across the regions 20, 30a, 50a, 30c, 50b, 30d, 50c, 30b and 40 of the device shown in FIG. 3. Again, as for the graph of FIG. 2, it should be appreciated that only the average fraction x across the undisordered superlattice regions 30a, 30b, 30c and 30d is shown and that in practice the fraction x will vary abruptly from x=0 in the gallium arsenide layers 32 to x=1 in the aluminum arsenide layers 31.

The laser semiconductor device shown in FIG. 3 is manufactured in a similar manner to the device shown in FIG. 1 with the exception that during formation of the intrinsic region 30, the opening and closing of the shutters of the gallium and aluminum effusion cells is controlled so as to form three gallium arsenide quantum well active regions 50a, 50b, 50c, each having a thickness of above 60 Angstroms separted by intrinsic superlattice regions 30c and 30d of the layers 31 and 32 each having a thickness of, for example, 100 Angstroms. It should of course be appreciated that the or each active region 50 could be formed as a superlattice region.

Figure 5:
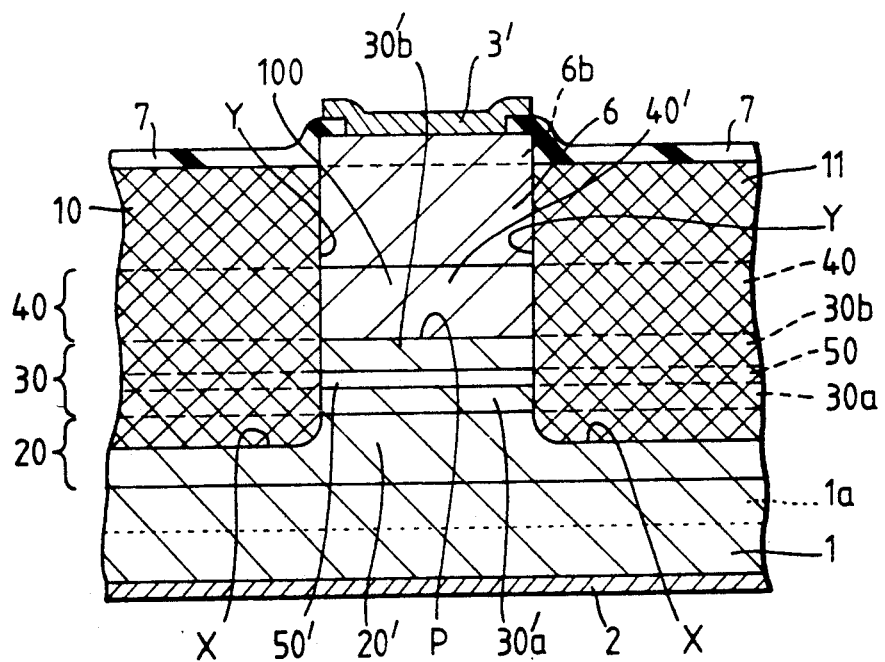
FIG. 5 is a cross-sectional view of a modified form of the device shown in FIGS. 1 and 2.

Although in the arrangements described above, the electrical contacts 2 and 3 are formed directly after growth of the laser device structure, further processing may be carried out on either of the devices shown in FIGS. 1 and 3 so as, for example, to provide a buried heterostructure laser as shown in FIG. 5.

The buried heterostructure laser shown in FIG. 5 is formed by, after growing the structure shown in FIG. 1 or FIG. 3 as described above, defining a mask (not shown) on a top surface 6a of the capping layer 6 and etching the capping layer 6 using conventional etching techniques to define a mesa structure 6b. The mesa structure 6b and mask (not shown) are then used as a mask for introducing impurities into the surface 6a to define on either side of the mask 7 highly conductive doped regions 10 and 11 bounding a stripe region 100 formed by the remaining portions 20', 30' and 40' of the first and second doped regions and the waveguide region.

The impurities introduced to form the doped regions 10 and 11 may be of either conductivity type and to illustrate this the doped regions 10 and 11 are shown cross-hatched in FIG. 5.

Where the impurity to be introduced is a highly mobile impurity which diffuses much more quickly than the dopants silicon and beryllium used for forming the first and second doped regions 20 and 40, then a diffusion process may be used for introducing the impurity. Thus, for example, where zinc is to be used as the dopant for forming the regions 10 and 11, then a process such as that described in EP-A-103415 may be used to introduce the zinc atoms.

As an alternative to relying solely on diffusion, a conventional ion implantation and diffusion technique may be used to form the regions 10 and 11. This has the advantage that by selecting a broad spread of implantation energies the dopant may be introduced throughout the areas to be disordered and only a small amount of diffusion will be necessary to effect the disordering enabling relatively slow moving dopants such as silicon to be used to form the regions 10 and 11 without causing significant undesired further movement of the silicon and beryllium atoms with which the first and second regions 20 and 40 are doped.

The first and second waveguide superlattice regions 30a and 30b may, for the device shown in FIG. 5, be lightly doped, for example, to a dopant concentration of $1 \times 10^{17}$ atoms cm$^{-3}$, by opening the shutter of the silicon or beryllium effusion cell during growth of the first and second waveguide superlattice regions 30a and 30b after having first adjusted the beam flux from the silicon effusion cell after growth of the first doped region 20. The quantum well active region(s) 50 may still not be intentionally doped.

Such low doping of the first and second waveguide superlattice regions 30a and 30b is not sufficient to cause disordering of the superlattices and serves to ensure that the injecting pn junction P within the stripe region 100 is formed at or adjacent the interface either between the relatively narrow bandgap second waveguide superlattice region 30b and the second doped region 40 where the first and second waveguide superlattice regions 30a and 30b are doped with n type impurities or between the relatively narrow bandgap first waveguide superlattice region 30b and the first doped region 20 where the first and second waveguide superlattice regions 30a and 30b are doped with p type impurities while the pn junctions with the highly doped disordered regions 10 and 11 are formed between the relatively wide bandgap alloy region 20 and the regions 10 and 11 so that the latter pn junctions have a higher turn-on voltage thereby ensuring in operation of the device that injection of carriers occurs at the pn junction within the laser stripe region 100.

After the introduction of the impurities to form the doped regions 10 and 11, the mask (not shown) is removed and a layer of silicon oxide deposited by a conventional chemical vapor deposition technique and then patterned to define an insulating layer 7. Electrically conductive material is then deposited to define electrical contacts 2 and 3' in a similar manner to the contacts 2 and 3 of FIGS. 1 and 3 except that, as shown in FIG. 5, the contact 3' contacts only the mesa structure 6a.

In the present example, the first and second waveguide superlattice regions 30a and 30b are lowly doped with n type impurities so that injecting pn junction P resides at or adjacent the interface between the second waveguide superlattice region 30b and the second doped region 40 as shown in FIG. 5. The location of the pn junctions with the doped regions 10 and 11 will, of course, depend on the conductivity type of the impurities introduced to form the regions 10 and 11. Thus, the pn junctions will lie at the interface X between the n conductivity type first doped region 20 and the remaining portions of the first and second waveguide superlattice regions 30'a and 30'b and the p conductivity type doped regions 10 and 11 when the doped regions 10 and 11 are doped with p conductivity type impurities. When the doped regions 10 and 11 are doped with n conductivity type impurities such as silicon then the pn junction will lie at the interface Y between the remaining portion of the p conductivity type second doped region 40' and capping layer 6 and the n conductivity type doped regions 10 and 11. In either case, as will be appreciated by those skilled in the art, in operation of the device to forward bias the pn junction P so as to inject carriers into the active region(s) 50', the disordered doped regions 10 and 11 have a larger bandgap and lower refractive index than the active region(s) 50' and the first and second waveguide superlattice regions 30a' and 30b' and thus serve to provide lateral carrier confinement and a lateral waveguide for light generated in operation of the device.

It should of course be appreciated that the conductivity types given above could be reversed so that the first doped region 20 is of p conductivity type and the second doped region 40 is of n conductivity type which would of course mean that the effect of the conductivity type of the impurities introduced to form the regions 10 and 11 with regard to the positioning of the pn junctions within the structure would be reversed.

The structures described above with reference to FIGS. 1, 3 and 5 need not necessarily form electrically pumped laser devices. Thus, for example, the structures shown in FIGS. 1, 3 and 5 may be designed as optically pumped laser devices in which case the first and second regions 20 and 40 could be doped with the same conductivity type impurity as no pn junctions would then be required.

Although in the arrangements described above, the alternate layers 21, 22, 31, 32, 41 and 42 of the first and second materials are of the same thickness throughout the device structure, this need not necessarily be the case. Thus, for example, the relative thicknesses of the aluminum arsenide and gallium arsenide layers 31 and 32 may be made different from the relative thicknesses of the layers 21 and 22 and 41 and 42 so as to adjust the difference in bandgap between the waveguide region 30 and the first and second doped regions 20 and 40.

The first and second materials need not necessarily be aluminum arsenide and gallium arsenide, it merely being necessary that a superlattice of the first and second materials when disordered during growth by dopant diffusion has a wider bandgap and lower refractive index than an undisordered lowly doped or intrinsic superlattice of similar structure. Thus, for example, other pairs of III-V materials such as GaSb and AlSb, InAs and AlAs or InP and GaP and pairs of II-VI or group IV semiconductor materials could be used.

Further, although the devices described above are semiconductor laser devices, the invention may be applied to other waveguide structures, for example, to a waveguide modulater or optical switch and could be used merely as a simple waveguide, in which case the active region(s) could be omitted.

From reading the present disclosure, other modifications will be apparent to persons skilled in the art. Such modifications may involve other features which are already known in the semiconductor art and which may be used instead of or in addition to features already described herein.

We claim:

1. A semiconductor device having a waveguide structure, comprising a first doped region grown on a semiconductor substrate as a superlattice region comprising alternate layers of a first and a second semiconductor material, a waveguide region grown on the first doped region and comprising at least a superlattice region comprising alternate layers of the first and second semiconductor materials, and a second doped region grown on the waveguide region as a superlattice region comprising alternate layers of the first and second semiconductor materials, characterized in that the layers forming the first and second doped regions are sufficiently thin and sufficiently highly doped such that disordering during growth causes the first and second doped regions to be formed of an alloy of the first and second semiconductor materials having a lower refractive index and a larger bandgap than the waveguide superlattice region.

2. A semiconductor device according to claim 1, further charaterized in that the waveguide region comprises two superlattice regions separated by an active region of the device.

3. A semiconductor device according to claim 2, characterized in that the active region comprises one or more quantum wells formed of one of the first and second materials bounded by barrier layers of the other of the first and second materials.

4. A semiconductor device according to claims 1, 2, or 3, further characterized in that the layers of the first material are all of the same thickness as are the layers of the second material.

5. A semiconductor device according to claim 1, 2, or 3 further characterized in that the device comprises a light-emitting device and in that one of the first and second regions is doped during growth with impurities of a first conductivity type and the other of the first and second regions is doped during growth with impurities of a second opposite conductivity type.

6. A semiconductor device according to claim 1, 2 or 3 characterized in that alloy regions are formed spaced-apart and extending through the second and the waveguide regions and into the first region by introducing impurities after formation of the second doped region.

7. A semiconductor device according to claim 1, 2 or 3 characterized in that the first and second materials are III-V compounds.

8. A semiconductor device according to claims 7, characterized in that the first and second doped regions are grown so that one of the first and second regions is doped with silicon and the other first and second doped regions is doped with beryllium.

* * * * *